United States Patent [19]

Wang et al.

[11] Patent Number: 5,508,212
[45] Date of Patent: Apr. 16, 1996

[54] SALICIDE PROCESS FOR A MOS SEMICONDUCTOR DEVICE USING NITROGEN IMPLANT OF TITANIUM

[75] Inventors: Jau-Jey Wang; Ming-Hsung Chang, both of Hsin-Chu, Taiwan

[73] Assignee: Taiwan Semiconductor Manufacturing Co., Hsin-chu, Taiwan

[21] Appl. No.: 429,729

[22] Filed: Apr. 27, 1996

[51] Int. Cl.$^6$ ........................................... H01L 21/28
[52] U.S. Cl. .................. 437/24; 437/41; 437/192; 437/193; 437/200
[58] Field of Search ........................ 437/193, 200, 437/24, 35, 41 RW, 41 SW, 192

[56] References Cited

U.S. PATENT DOCUMENTS 5,270,227  12/1993  Kameyama et al. ................... 437/35

FOREIGN PATENT DOCUMENTS 63-181422  7/1988  Japan .
63-175420  7/1988  Japan .
 1276746  11/1989  Japan .

Primary Examiner—George Fourson
Assistant Examiner—Thomas G. Bilodeau
Attorney, Agent, or Firm—George O. Saile; William J. Stoffel

[57] ABSTRACT

A salicide process for manufacturing a lightly doped drain (LDD) MOS transistor having unshorted titanium silicide gate electrode and source/drain contacts. The salicide method comprises forming a titanium (Ti) layer on the surface of the substrate, the sidewall spacers and the gate electrode. Nitrogen is implanted at a large angle into the Ti layer, especially over the sidewall spacers, thus converting all the titanium layer over the spacers to titanium nitride. Next, the titanium layer is thermally annealed forming titanium silicide on the top surface of the gate electrode and in the highly doped source/drain regions. The titanium nitride layer and any of the remaining titanium layer is etched away thereby leaving unshorted titanium silicide on the top surface of the gate electrode and in the highly doped source/drain regions. The TiN layer over the sidewall spacers prevents a titanium silicide bridge from forming between/he gate electrode and the source/drain regions during the thermal anneal process. This prevent electrical shorting between titanium silicide on the top surface of the gate electrode and the highly doped source/drain regions.

19 Claims, 4 Drawing Sheets

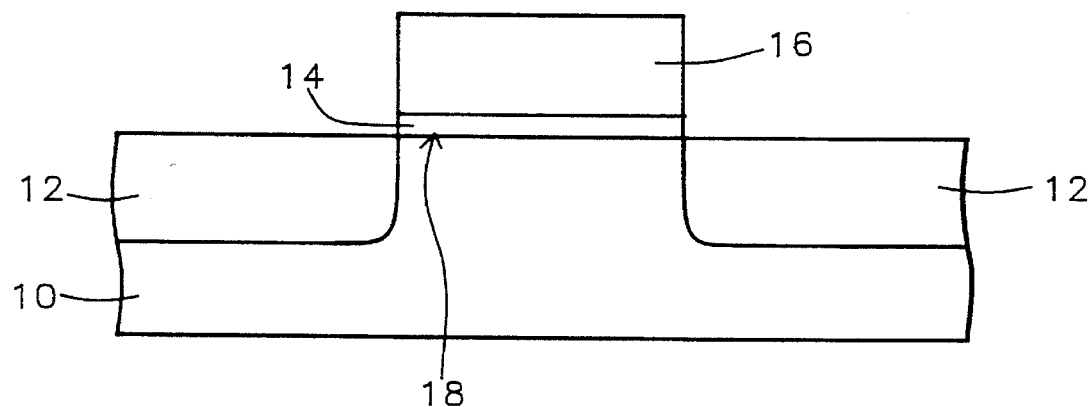
FIG. 1A – Prior Art
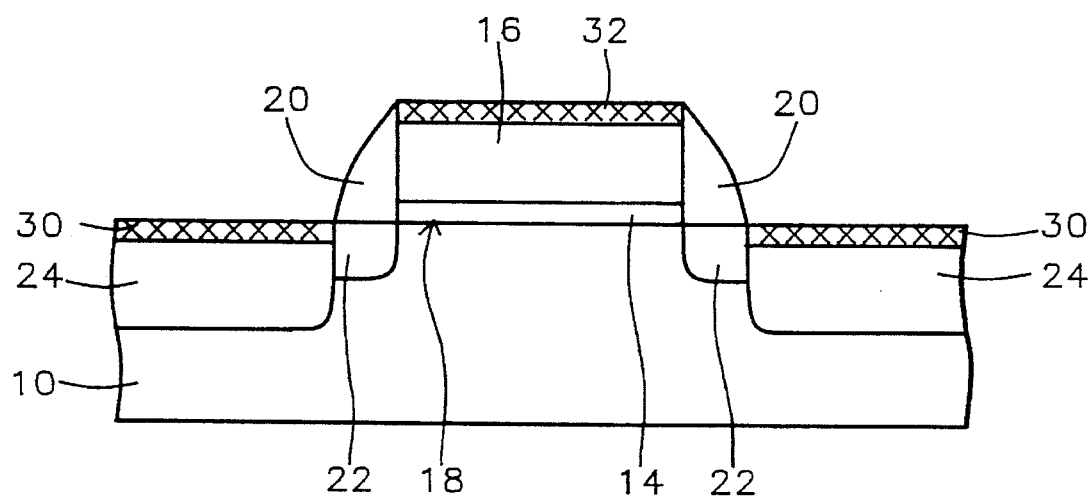
FIG. 1B – Prior Art

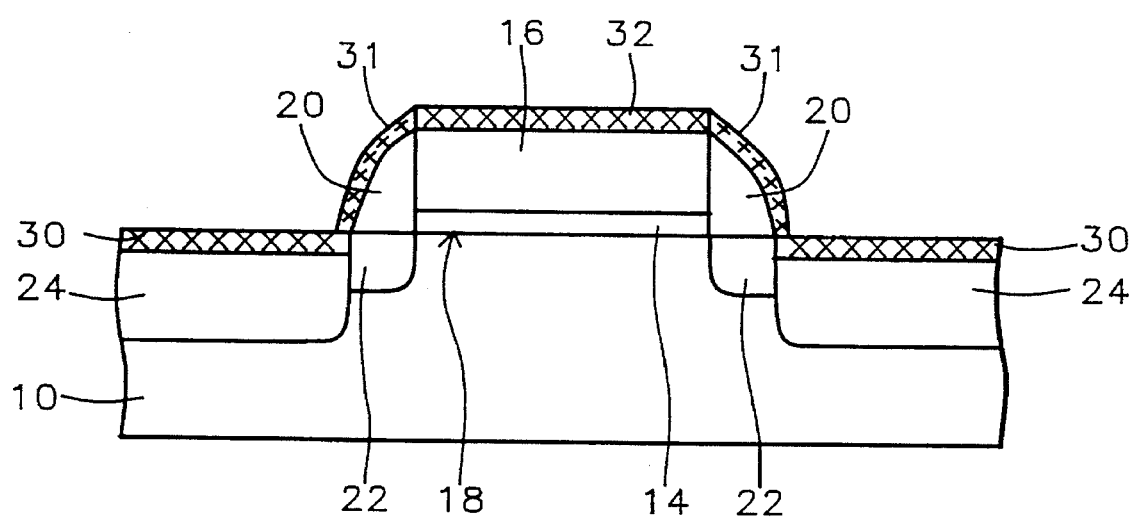
FIG. 1C – Prior Art

SALICIDE PROCESS FOR A MOS SEMICONDUCTOR DEVICE USING NITROGEN IMPLANT OF TITANIUM

BACKGROUND OF INVENTION

1) Field of the Invention

The present invention relates to a semiconductor device and a method of manufacturing thereof and, more particularly, to an improvement of a method for manufacturing gate, source, and drains regions of a metal-insulator-semiconductor (MIS) transistor comprising a salicide structure and a lightly doped drain (LDD) structure that prevents shorting between the gate and source/drain silicide regions.

2) Description of the Prior Art

A semiconductor device having a stacked structure of metal-insulator-semiconductor is called a MIS semiconductor device. A transistor using an oxide film as the insulator is especially called a MOSFET (Metal Oxide Semiconductor Field Effect Transistor). FIG. 1A shows a cross sectional structure of a typical MOSFET. The MOSFET comprises a pair of source/drain regions (n type for a N-MOSFET or p-type for a P-MOSFET) 12 on a surface of a silicon substrate 10, a gate oxide film 14 formed on the substrate between the source/drain 12, and a gate electrode 16 formed on the surface of the gate oxide film 14. A N-type MOSFET will be described but P-type MOSFET devices are also possible. The surface area of the substrate between the source/drain regions 12 is called a channel region 18. The length of the channel region 18 is distance between the source/drain regions 12.

In operation, a prescribed potential $V_D$ is applied between the source/drain 12. When a gate voltage $V_G$ larger than the threshold voltage $V_{TH}$ is applied to the gate electrode 16. an n type inverted layer where electrons are induced is formed in the channel region 18 for an n-MOSFET. Consequently, a drain current $I_D$ flows between the source and the drain 12. A depletion layer extends around the source and the drain regions 12.

To increase the speed of the transistor, the transistor structure is continuously being made smaller. The MIS transistor is miniaturized by shortening the channel length or forming source/drain regions having a shallow junction in accordance with a scaling rule in principle. However, the following two problems occur when making the transistor smaller, especially making the channel length shorter.

First, short channel effects due to the shortening of the channel of the transistor becomes problematic. Because of the short channel effect, a breakdown phenomenon, and a hot electron effect are generated in the vicinity of the drain, so that reliability is decreased and the transistor performance is degraded.

One of the short channel effects is the hot electron effect. A strong electric field is generated near the drain of a MISFET (MOSFET) having a short channel. Electrons introduced to this strong electric field region generate hot carriers by impact ionization. Some of the generated hot carriers are caught by traps in the gate oxide film 14 of the MOSFET and are accumulated as time passes. The accumulated carriers cause changes of the threshold voltage $V_{TH}$ with time and deterioration of mutual conductance, significantly reducing the reliability of the MOSFET.

The second problem encountered when miniaturizing the MOSFET transistor is that the wiring resistance of the source/drain impurity diffusion layer and gate electrode layer increase thereby reducing the transistor speed. At the source/drain regions, the resistance is increased as the junction depth becomes shallower and the conductive area becomes smaller. At the gate electrode, the resistance is increased as the gate length becomes shorter and the conductive area becomes smaller. Because of the increase in wiring resistance, the high speed responsiveness of the transistor is degraded.

As a structure for eliminating these problems, a lightly doped drain (LDD) structure was adopted to prevent the short channel effect and, in addition, as a structure for preventing the increase in wiring resistance, a salicide structure was proposed. FIG. 1B is a diagram of a conventional MIS transistor having such structure. A n-type FET device is described below but p-type devices are also possible.

Referring to the FIG. 1B, a gate electrode 16 comprising polysilicon is formed on a silicon substrate 10 over a gate oxide film 14. Sidewall spacers 20 serve as insulating films are formed on either side of the gate electrode 18. N<-> impurity regions (i.e., lightly doped source/drain regions) 22 with low concentration are formed at a self-aligning position with the gate electrode 16 on the p type silicon substrate 10 or well. In addition, n<+> impurity regions (i.e., highly doped source/drain regions) 24 with high concentrations are formed at a self-aligning position with the sidewall spacers 20. Each n<-> impurity region 22 and n<+> impurity region 24 constitutes a source and drain region 22 24 of the transistor. In addition, a structure of the impurity region having a structure in which the positions of the n<-> impurity region 22 with low concentration and the n<+> impurity region 24 with high concentration are offset is referred to as a lightly doped drain (LDD) structure.

Also, salicide layers 30 comprising titanium silicide are formed on the upper surface of the gate electrode 16 and the surface of the highly doped source/drain regions 24. The structure of the silicide layers 30 32 that are formed in a self-alignment manner on the gate electrode 16 and the highly doped source/drain regions 24 is referred to as a "salicide structure".

The lightly doped source/drain impurity regions 22 constituting the LDD structure are positioned such that the impurity concentration distribution between the highly doped source/drain regions 24 and a channel region 18, just beneath the gate electrode 16, may be made gently sloping. As a result, the electric field concentration, particularly on the side of the drain region is mitigated and the generation of the breakdown phenomenon and hot carriers are restrained.

In addition, the silicide layers 30 32 constituting the salicide structure have a higher conductivity. The wiring resistance of the gate electrode 16 and the sheet resistance of the source/drain regions 22 24 are reduced.

However, the LDD MOSFET additionally causes the following two problems. Referring to FIG. 1B, a description is made of manufacturing steps of the conventional LDD MOS transistor.

A thin gate oxide film 14 is formed on a p type silicon substrate 10. Then, a polysilicon layer is formed on the surface of the gate oxide film 14 to form a gate electrode 16 by patterning the gate oxide film 14 and the polysilicon layer. N type impurity ions are implanted on the p type silicon substrate 10 with a small dosage using the gate electrode 16 as a mask to form n<-> impurity regions 22 and 22.

Next, a silicon oxide film of the thickness approximately equal to about 2500 Angstrom is formed on the p type silicon substrate 10 on which the gate electrode 16 was formed. Then, sidewall spacers 20 are formed on either side of the gate electrode 16 by anisotropic etching the silicon oxide film. Next, the n type impurity ions are implanted into the p type silicon substrate 10 with a large dosage using these sidewall spacers 20 and the gate electrode 16 as a mask to form highly doped source drain regions 24.

A refractory metal layer, such as titanium, is evaporated on the surface of the silicon substrate 10, the gate electrode 16, and the sidewall spacers 20. Thereafter, high temperature heat treatment is performed and the refractory metal layer is made to react with the polysilicon layer of the gate electrode 16 and source/drain regions 30 in contact with the refractor metal layer to form a silicide layer. The heat treatment can be done by rapid thermal anneal (RTA) lamp annealing method in N2 gas atmosphere at about 600° C.

Next, the unreacted refractory metal layer evaporated on the surface of the sidewall spacers 20 is removed. Silicide layers 30 32 are formed in a self-alignment manner on the surface of the gate electrode 16 and the highly doped source drain regions 24.

The sidewall spacers 20 fulfill two functions. First, they function as a mask to selectively form the silicide layer of the refractory metal layer. Theoretically, the sidewall spacers are not supposed to react with the refractory metal layer 30 32. The silicide regions on the top surface of the gate electrode 32 and on the source/drain regions 30 are separated by the sidewall spacer and self-aligned. However, as shown in FIG. 1C, with the conventional process, silicon can diffuse over the spacers 20 from the source/drain regions 24 and the gate electrode 16. The diffused silicon will react with the titanium over the spacers 20, thus forming a titanium silicide bridge 31 over the spacers 20. This titanium silicide formation over the spacers is called a "bridging problem". The bridging problem reduces device yields by electrically shorting the source/drain 24 to the gate electrode 16. The silicide rapid thermal anneal must be tightly controlled to minimize the silicon diffusion which causes the bridge formation, Second, the sidewall spacer 20 functions to define the offset length of the n<–> impurity region 22 and n<+> impurity region 24 of the source and drain region. That is, the length of the n<–> impurity region 22 is substantially defined by the film thickness of this sidewall spacer 20. However, in practice the minimum thickness of the sidewall spacer 20 is limited by the requirement to separate the silicide regions 30 32, so the minimum length of the lightly doped source/drain region 22 is also limited. In the conventional process, the minimum sidewall spacer thickness is determined largely by the rapid thermal anneal temperature and times. i.e., the higher temperature and longer the anneal, the thicker the spacer must be.

Overall, to increase transistor speed, the sidewall spacer thickness must be reduced, but at the same time the silicide layers 30 and 32 must be electrical separated (not shorted together). By reducing the spacer thickness, the parasitic resistance of the lightly doped source/drain is reduced, thus increasing the transistor speed. However, a reliable simple manufacturing process must be developed that allows use thin sidewall spacers while ensuring that the silicide bridge problem 31 does not short out the source/drain 24 to the gate electrode 16. A manufacturing process is need to eliminate the salicide bridge problem that occurs when using thin sidewall spacers.

SUMMARY OF THE INVENTION

It is an object of the present invention to provide a method of forming a semiconductor device having titanium silicide contacts to the gate electrode and source/drain regions that are electrically isolated.

It is a further object of the present invention to provide a method of forming a lightly doped drain MOS transistor which prevents silicon from diffusing over the sidewall spacers and short the titanium silicide layer between the gate electrode and the source/drain regions.

It is another objective of the present invention to provide a method of forming titanium silicide source contacts which allows a larger silicide thermal anneal process window thus allowing more conductive titanium silicide contacts to be formed.

It is yet another object of the present invention to provide a method of forming a salicide structure on a lightly doped drain (LDD) MOS transistor which allows use of thinner sidewall spacers while preventing shorts between the silicide of the gate electrode and the source/drain regions.

In accordance with the above objectives a process for forming a semiconductor device having a salicide structure and a lightly doped drain structure is provided. The method comprises forming a gate insulating layer and a gate electrode. Next, lightly doped source/drain regions are formed by implanting impurities into the substrate using the gate electrode as a mask. Sidewall spacers are then formed on a vertical sidewalls of the gate electrode on a substrate. Highly doped source/drain regions are formed by implanting impurities into the substrate using the gate electrode and the sidewall spacers as a mask to form highly doped source/drain regions.

Then a titanium layer is formed on the surface of the semiconductor substrate, the sidewall spacers, and the gate electrode. Nitrogen is implanted at a large angle into the titanium layer thus forming a titanium nitride layer over the titanium layer. The large angle implant ensures that a high dose of nitrogen is implanted deeper into the titanium layer on the vertical sidewall spacers than into the flat gate and source/drain contact regions. This will ensure that the titanium layer over the sidewall spacer will subsequently form almost entirely into titanium nitride. This will prevent the "bridge" shorting problem.

Next, the titanium layer is thermally annealed forming titanium silicide on the top surface of the gate electrode and in the highly doped source/drain regions. The titanium nitride layer and any of the remaining unreacted titanium layer is etched away thus leaving unshorted titanium silicide on the top surface of the gate electrode and in the highly doped source/drain regions.

The TiN layer over the sidewall spacers prevents silicon diffusion from the gate electrode and source/drain regions over the sidewall spacers during the thermal anneal process. This prevents electrical shorting between the titanium silicide contacts on the top surface of the gate electrode and in the highly doped source/drain regions. This invention allows the use of thinner sidewall spacers while preventing shorts between silicide thereby increasing transistor performance. In addition, more uniform and more conductive titanium silicide contacts are formed.

BRIEF DESCRIPTION OF THE DRAWINGS

The drawings show the following:

FIG. 1A shows a cross sectional view of a MOS transistor of the prior art.

FIG. 1B shows a cross sectional view of a lightly doped drain (LDD) MOS transistor of the prior art.

FIG. 1C shows a cross sectional view of a LDD MOS transistor of the prior art having the shorted silicide bridge problem.

DETAILED DESCRIPTION OF THE PREFERRED EMBODIMENTS

According to the present invention a method of manufacturing a semiconductor device having a salicide structure and a lightly doped drain (LDD) structure is provided. The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations. It should be noted that a n-type MOS transistor on a P-type substrate is described but the invention is applicable to opposite conductivity type devices (i.e., P-type). The substrate 10 shall be a monocrystalline silicon semiconductor body with many devices fabricated therein, as is well known in the art. The substrate 10 is preferably formed of monocrystalline silicon preferably having a crystalline orientation of <100>. The background substrate dopant is of first conductivity type, and preferably P-type, preferably with boron impurity with a concentration in the range of 5E15 to 5E17 atoms/cm$^3$.

Figure 2:
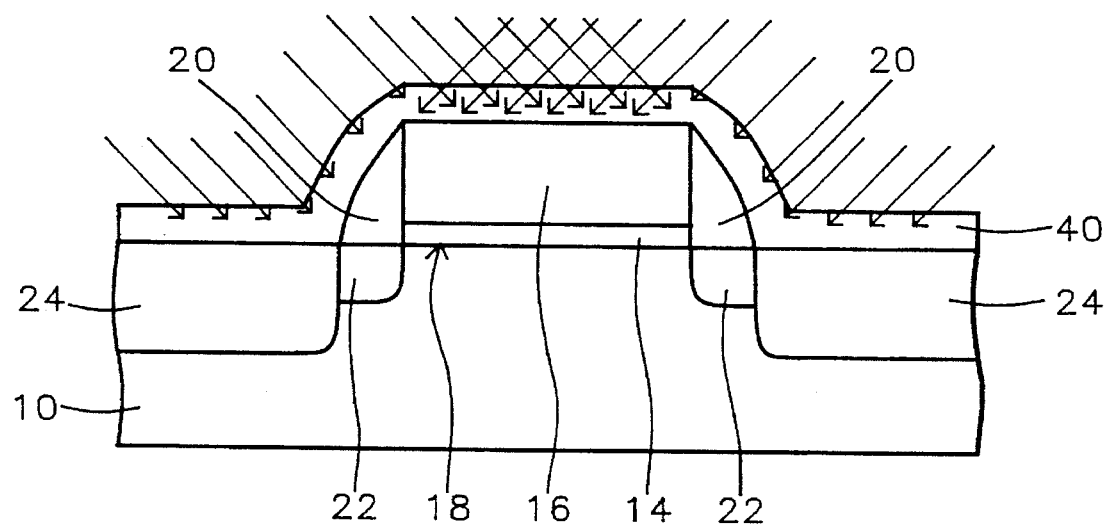
FIG. 2 through 5 show the process of the present invention for forming silicide for a lightly doped drain MOS device.

Referring to FIG. 2, a gate insulating layer 14 is formed on the surface of a semiconductor substrate 10. The gate insulating layer has a thickness in the range of about 100 to 200 Å. A polysilicon layer is next formed on the gate insulating film. The polysilicon layer is then patterned into a gate electrode having vertical sidewalls and a top surface. The gate electrode can have a thickness in the range of about 3000 to 4000 Å.

Impurity ions are implanted into the semiconductor substrate using the gate electrode as a mask to form lightly doped source/drain regions. The ions can be phosphorus and can be implanted at a dose between about 2E13 to 4E13 atom/sq. cm. and at an energy of about 50 to 70 Kev. The lightly doped source/drain regions 24 can have a concentration in the range of about 2E17 to 7E17 ions/cc.

Subsequently, a first insulating film (not shown) is formed on the surface of the semiconductor substrate and on the surface of the gate electrode. The first insulating film can be formed of silicon oxide formed by a chemical vapor deposition process.

The first insulating film (not shown) is then patterned to form sidewall spacers 20 on the sidewalls of the gate electrode 16 by performing anisotropic etching of the first insulating film. Anisotropic etching can be performed on the first insulating film using a reactive ion etching method to form widewall spacers 20 of the first insulating film on the sidewalls of the gate electrode 16. Consequently, the film thickness of the sidewall spacers 20 is the same as that of the first insulating film. The sidewall spacers have a thickness in the range of about 1500 to 3000 Å. The step of patterning the first insulation film can comprise forming the sidewall spacers on the sidewalls of the gate electrode 16 and on the surface of the semiconductor substrate and in contact with the gate insulating layer 14. As shown in the FIG. 2, the offset distance between the lightly doped region 22 and highly doped regions 24 is defined by the thickness of the sidewall spacer 20.

Impurities are now interdicted into the semiconductor substrate using the gate electrode 14 and the sidewall spacers 20 as a mask to form highly doped source/drain regions 24. The ions can be arsenic of phosphorus and can be implanted at a dose between about 2E15 to 5E15 ions/cm$^2$ at an energy of about 30 to 100 Kev. The highly doped source/drain regions 24 can have a concentration in the range of about 1E20 to 3E20 ions/cc.

Then, heat treatment is performed at approximately 800° to 900° C. in order to activate the lightly doped source drain impurity regions 22 and the highly doped source drain regions 24. The lightly doped source/drain impurity regions 22 the highly doped source drain regions 24 also diffuse in the channel's direction during this heat treatment. Therefore, by controlling the temperature and time of this heat treatment, the heat treatment is performed until the interface between the lightly doped source/drain region 22 and the highly doped source/drain region 24 almost corresponds to the position of the sidewalls of the gate electrode 16.

A titanium layer 40 is then formed on the surface of the semiconductor substrate, the sidewall spacers 20, and the gate electrode 14. The titanium layer can be deposed using a conventional sputtering method. The titanium layer 40 can have a thickness in the range of between about 600 to 1000 Å and more preferably a thickness between about 700 to 900 Å.

Figure 3:
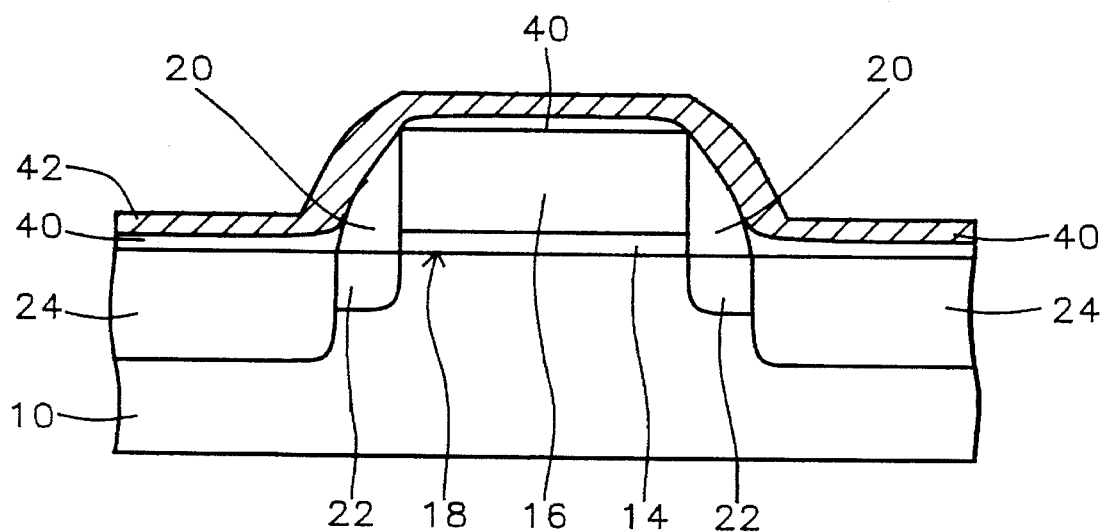

Subsequently, nitrogen is implanted at a large angle into the titanium layer 40 thus forming a titanium nitride layer 42 over the titanium layer 40 as shown in FIGS. 2 and 3. The nitrogen is implant with a dose in the range of about 1E15 to 3E13 atoms/cm$^2$ and with an energy of about 30 to 80 Kev. The nitrogen is implanted at an angle from the surface plane of the substrate of between about 30° to 60° (the angle is measured from the horizontal surface plane of the substrate).

The nitrogen implant converts most or all the titanium layer on the sidewall spacers to TiN thus preventing titanium silicide (TiSix) from forming on the sidewall spacers. The TiN prevents silicon from diffusion from the source/drain contacts and the gate, over the surface of the spacers and thereby prevents the silicon from reacting with the Ti on the spacer surfaces. This eliminates the silicide bridging problems shown in FIG. 2C.

The titanium nitride layer 42 over the sidewall spacers can have a thickness in the range of about 600 to 1000 Å. The titanium nitride layer 42 over the top gate electrode 16 surface and the highly doped source/drain regions 24 can have a thickness in the range of about 300 to 500 Å.

Figure 4:
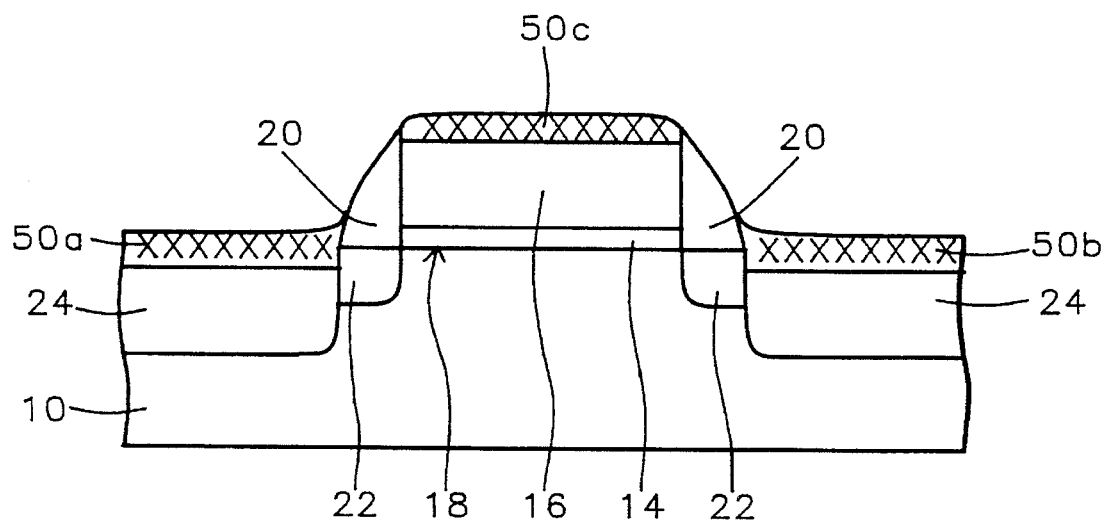

As shown in FIG. 4, the titanium layer 40 is thermally annealed thus forming titanium silicide 50, 52 on the top surface of the gate electrode 16 and in the highly doped source/drain regions 24. The thermal treatment of the titanium layer 40 is performed at a temperature between about 650° and 750° C. and preferably at about 700° C. for a time between about 30 and 60 seconds using a map heating method and the like. The titanium silicide layer 40 can have a thickness in the range of about 600 to 1000 Å. A reaction is generated in the regions of the titanium layer 40 in contact with the silicon layer on the surface of the silicon substrate 10 or the polysilicon layer on the surface of the gate electrode 16 through this heat treatment to form titanium silicide layers 50 and 52.

The sidewall spacers 20 serve as a separation mask for forming the titanium silicide layers 50 52 in a selective and self-aligning manner on the surface of the gate electrode 16 and the surface of the highly doped source drain regions 24, respectively.

A silicide bridge 31 (i.e., a short) between the silicide layers 30 and 32 is prevented by using the large angle nitrogen implant to convert all the Ti on the sidewall spacers to the inert TiN thus preventing the formation of a TiSix bridge on the sidewall spacers 20. This nitrogen implant and TiN formation allow the use of thinner sidewall spacers without the yield losses due to the titanium silicide ($TiSi_x$) bridges between the silicide regions 50A 50B 50C.

As shown in FIG. 4, the titanium nitride layer 42 and any of the remaining titanium layer is now etched away thus leaving unshorted titanium silicide on the top surface of the gate electrode 50C and in the highly doped source/drain regions 50a 50B. The etch can be performed using $NH_4OH$, $H_2O$, and $H_2O_2$, in a ratio of 1:12:5 for about 20 minutes at a temperature between about 30° and 50° C.

Figure 5:
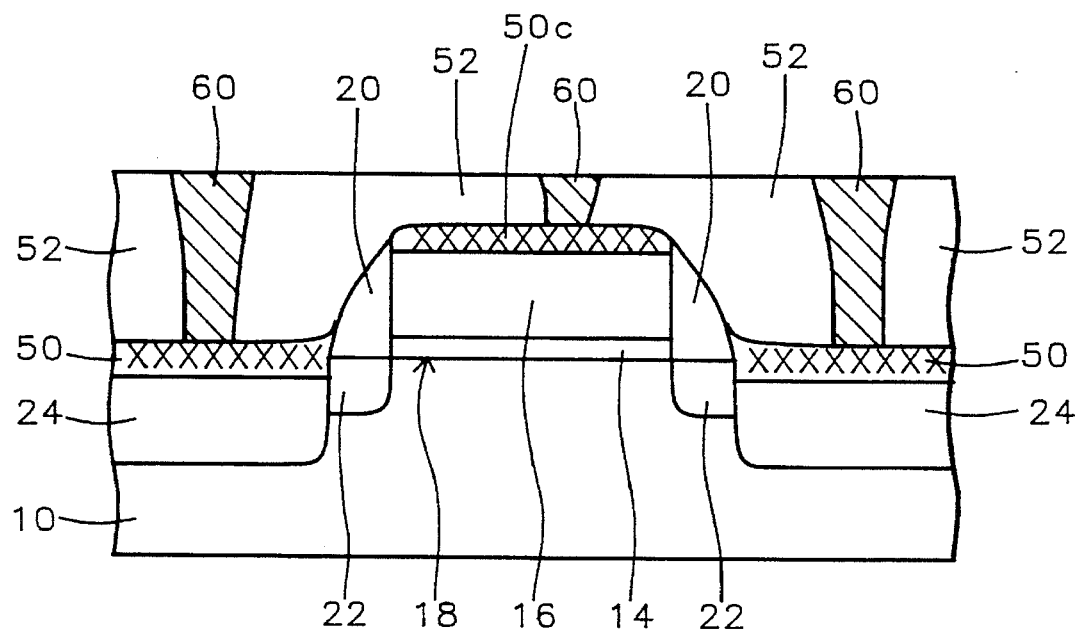

Structure having the silicide layers 50A 50B 50C formed in a self-alignment manner on the surface of the gate electrode 16 and the source and drain regions 24 constitute the salicide structure. As shown in FIG. 5, wiring layers 60 are connected to the gate and source/drain regions 16, 24. The surface of the MOS transistor is covered with an interlayer insulating layer 52.

The process of the invention has the advantage of preventing the "bridging problem" 31 (see FIG. 1C) where a silicide layer forms over the sidewall spacers 20 thus shorting the source/drain contacts 50a 50b with the gate electrode 50c. Also, the invention provides a larger silicide anneal process window (time and temperature) because silicon diffusion over the spacers is not a limiting factor. Also, the larger silicide anneal process window allows a better anneal which yields more conductive source/drain silicide contact. Moreover, the process provides higher conductive silicide contacts which increase transistor performances. The TiN layer 40 formed over the source/drain areas (which is etched away) makes the underlying titanium silicide layer smoother and more conductive.

Although the present invention was applied to a n-type MOS transistor in the above-described embodiment, it also can be applied to a p type MOS transistors, CMOS, and other device types as is apparent to those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a semiconductor device having a salicide structure and a lightly doped drain structure, the method comprising the steps of:

forming a gate insulating layer on the surface of a semiconductor substrate;

forming a polysilicon layer on said gate insulating layer;

patterning said polysilicon layer into a gate electrode having vertical sidewalls and a top surface;

introducing impurities into said semiconductor substrate using said gate electrode as a mask to form lightly doped source/drain regions;

forming a first insulating layer on the surface of said semiconductor substrate and on said gate electrode;

patterning said first insulating layer to form sidewall spacers on the sidewalls of said gate electrode by anisotropic etching said first insulating layer;

introducing impurities into said semiconductor substrate using said gate electrode and said sidewall spacers as a mask to form highly doped source/drain regions; then:

forming a titanium layer on the surfaces of said semiconductor substrate, said sidewall spacers, and said gate electrode;

implanting nitrogen at an angle from the surface plane of said substrate from between about 30° and 60° into said titanium layer thus forming a titanium nitride layer over said titanium layer;

thermally annealing said titanium layer forming titanium silicide on the top surface of said gate electrode and in said highly doped source/drain regions; and etching said titanium nitride layer and any of the remaining titanium layer thereby leaving titanium silicide on the top surface of said gate electrode and in said highly doped source/drain regions.

2. A method for manufacturing a semiconductor device in accordance with claim 1, wherein the step of patterning said first insulation film comprises forming said sidewall spacers on said sidewalls of said gate electrode and on said surface of said semiconductor substrate and in contact with said gate insulating layer.

3. A method for manufacturing a semiconductor device in accordance with claim 1, wherein said gate insulating layer has a thickness in the range of about 100 to 200 Å.

4. A method for manufacturing a semiconductor device in accordance with claim 1, wherein said sidewall spacers have a thickness in the range of about 1500 to 3000 Å.

5. A method for manufacturing a semiconductor device in accordance with claim 1, wherein said titanium layer has a thickness in the range of about 600 to 1000 Å.

6. A method for manufacturing a semiconductor device in accordance with claim 1, wherein the portion of said titanium nitride layer which is over said sidewall spacers has a thickness in the range of about 600 to 1000 Å.

7. A method for manufacturing a semiconductor device in accordance with claim 1, wherein said the portion of titanium nitride layer which is over the top surface of said gate electrode and highly doped source/drain regions has a thickness in the range of about 300 to 500 Å.

8. A method for manufacturing a semiconductor device in accordance with claim 1 wherein the implanting of nitrogen includes implanting nitrogen at an energy between about 30 and 70 keV and a dose between about 1E15 and 3E15 ions/sq. cm.

9. A method for manufacturing a semiconductor device in accordance with claim 1 wherein the thermal annealing of the titanium layer further includes heating said titanium layer at a temperature between about 650° to 750° C. for a time between about 30 and 60 seconds.

10. A method for manufacturing a semiconductor device in accordance with claim 1 wherein the etching of said titanium nitride layer and titanium layer includes using $NH_4OH$, $H_2O_2$, and $H_2O$, at a temperature about 30° and 50° C.

11. A method for manufacturing a FET semiconductor device having a gate electrode, spaced highly doped source/drain regions with lightly doped source/drain regions, said gate electrode over a gate oxide layer over a semiconductor substrate, said gate electrode having sidewall spacers, the method comprising the steps of:

forming a titanium layer on the surface of said semiconductor substrate, said sidewall spacers, and said gate electrode;

implanting nitrogen at an angle from the surface plane of the substrate from between about 30° and 60° into said titanium layer thus forming a titanium nitride layer over said titanium layer, thermally annealing said titanium layer forming titanium silicide on the top surface of said gate electrode and in the highly doped source/drain regions, and etching said titanium nitride layer and any of the remaining titanium layer thereby leaving titanium silicide on the top surface of said gate electrode and in said highly doped source/drain regions.

12. A method for manufacturing a semiconductor device in accordance with claim 11, wherein said gate insulating layer has a thickness in the range of about 100 to 200 Å.

13. A method for manufacturing a semiconductor device in accordance with claim 11, wherein said sidewall spacers have a thickness in the range of about 1500 to 3000 Å.

14. A method for manufacturing a semiconductor device in accordance with claim 11, wherein said titanium layer has a thickness in the range of about 600 to 1000 Å.

15. A method for manufacturing a semiconductor device in accordance with claim 11, wherein the portion of said titanium nitride layer which is over said sidewall spacers has a thickness in the range of about 600 to 1000 Å.

16. A method for manufacturing a semiconductor device in accordance with claim 11, wherein the portion of said titanium nitride layer which is over the top surface of said gate electrode and highly doped source/drain regions has a thickness in the range of about 300 to 500 Å.

17. A method for manufacturing a semiconductor device in accordance with claim 11 wherein the implanting of nitrogen includes implanting nitrogen at an energy between about 30 and 70 keV and a dose between about 1E15 and 3E15 ions/sq. cm.

18. A method for manufacturing a semiconductor device in accordance with claim 11 wherein the thermal annealing of the titanium layer further includes heating said titanium layer at a temperature between about 650° to 750° C. for a time between about 30 and 60 seconds.

19. A method for manufacturing a semiconductor device in accordance with claim 11 wherein the etching of said titanium nitride layer and titanium layer includes using $NH_4OH$, $H_2O_2$, and $H_2O$ at a temperature between about 30° and 50° C.

* * * * *

UNITED STATES PATENT AND TRADEMARK OFFICE
CERTIFICATE OF CORRECTION

PATENT NO. : 5,508,212
DATED : April 16, 1996
INVENTOR(S) : Jau-Jey Wang et al.

It is certified that error appears in the above-indentified patent and that said Letters Patent is hereby corrected as shown below:

On the title page, correct the filing date from "April 27, 1996" to —April 27, 1995—.

Signed and Sealed this

Twenty-second Day of October, 1996

Attest:

BRUCE LEHMAN

Attesting Officer

Commissioner of Patents and Trademarks